United States Patent
Lawlyes

(10) Patent No.: US 6,998,706 B2
(45) Date of Patent: Feb. 14, 2006

(54) RELAXED TOLERANCE FLIP CHIP ASSEMBLY

(75) Inventor: Daniel A. Lawlyes, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/955,706

(22) Filed: Sep. 30, 2004

(65) Prior Publication Data

US 2005/0040521 A1    Feb. 24, 2005

Related U.S. Application Data

(62) Division of application No. 10/461,577, filed on Jun. 13, 2003, now Pat. No. 6,821,816.

(51) Int. Cl.
*H01L 23/34* (2006.01)

(52) U.S. Cl. ............... 257/712; 257/723; 257/778

(58) Field of Classification Search ........ 257/706–707, 257/710, 718, 712–714, 723, 778; 361/697, 361/702–703
See application file for complete search history.

(56) References Cited

U.S. PATENT DOCUMENTS

| | | | |
|---|---|---|---|
| 5,770,477 A | 6/1998 | Brandenburg | |
| 5,914,535 A | 6/1999 | Brandenburg | |
| 5,953,814 A | 9/1999 | Sozansky et al. | |
| 6,180,436 B1 | 1/2001 | Koors et al. | |
| 6,262,489 B1 | 7/2001 | Koors et al. | |
| 6,365,954 B1 | 4/2002 | Dasgupta | |
| 6,365,964 B1 * | 4/2002 | Koors et al. ............... 257/718 |

* cited by examiner

*Primary Examiner*—Roy Potter
(74) *Attorney, Agent, or Firm*—Stefan V. Chmielewski

(57) ABSTRACT

A method and assembly (10) for conducting heat from a semiconductor device, such as a power flip chip (12). The assembly (10) is generally constructed to dissipate heat from the flip chip (12) when mounted to a flexible or rigid substrate (20). Heat is conducted from the flip chip (12) through upper and lower pedestals (26, 28) each of which includes a pliable pre-cured silicone adhesive pad (32, 36). The pre-cured silicon adhesive pads (32, 36) promote thermal contact while also decoupling any lateral mechanical strains that may arise as a result of different thermal expansion and movement between the flip chips (12). The housing portions (16, 18) form a housing (14) when assembled, with each housing portion (16, 18) including a configured edge (37, 41) that controls the travel of the pedestals (26, 28) toward each other, to thereby limit the pressure exerted on the flip chip (12) disposed therebetween. Silicone adhesive can be applied between the edges (37, 41) to hold the housing portions (16, 18) together.

11 Claims, 2 Drawing Sheets

RELAXED TOLERANCE FLIP CHIP ASSEMBLY

This is a division of application Ser. No. 10/461,577 filed Jun. 13, 2003 now U.S. Pat. No. 6,821,816.

TECHNICAL BACKGROUND

The subject invention relates generally to an electronic assembly containing flip chip components on a laminate circuit board within the electronic assembly and, more particularly, to an apparatus and method of providing a relaxed tolerance assembly for the flip chip components and laminate circuit board with respect to heat dissipating structures of the assembly.

BACKGROUND OF THE INVENTION

A variety of methods are known for dissipating heat generated by semiconductor devices. In the case of semiconductor devices mounted on a circuit board and mounted within an enclosure, thermal management is usually achieved by dissipating heat primarily in the vertical direction, both above and beneath the semiconductor device. For example, heat-generating semiconductor chips, such as power flip chips, are often mounted to alumina substrates that conduct and dissipate heat in the vertical direction away from the chip.

One form of assembly utilizes a housing having a plurality of heat sink devices in the form of pedestals that are adapted to be both above and below the flip chip when the housing is assembled. The flip chips are made to come into contact with the pedestals through contact pressure. Additionally, thermal grease is used between the flip chip and the pedestal. The thermal grease provides a conductive path between the heat sink and the flip chip. The thermal grease also protects the flip chip due to the contact pressure required to maintain the heat sink to the flip chip for proper thermal contact.

This type of enclosure and/or heat dissipating method, however, requires fairly close tolerances. Particularly, these systems require fairly precise measurement and control.

SUMMARY OF THE INVENTION

It is an object of the subject invention to provide a system, method and/or apparatus for conducting heat from a flip chip semiconductor device mounted to a substrate that requires less tolerance in providing thermal contact between the flip chip and the heat dissipating structure or heat sink.

It is another object of the subject invention to provide a system, method and/or apparatus for conducting heat from a flip chip assembly that minimizes critical height tolerance requirements between a flip chip and a heatsink pedestal.

It is yet another object of the subject invention to provide a system, method and/or apparatus for conducting heat from a flip chip assembly that does not require thermal grease.

In accordance with a preferred embodiment of the subject invention, these and other objects and advantages are accomplished as follows.

According to the subject invention, there is provided a system, method and/or apparatus or assembly for conducting heat from a flip chip semiconductor device such as a power flip chip.

In one form, there is provided a heat-dissipating assembly for removing heat from a flip-chip semiconductor device.

The assembly includes a housing having a thermally-conductive first housing portion and a second housing portion, a flexible substrate supported within the housing, the substrate having conductors thereon, a flip chip mounted to the substrate, the flip chip having a first surface and solder bumps on the first surface registered with the conductors on the substrate, the flip chip having a second surface oppositely disposed from the first surface, a first heat sink extending inwardly towards the flip chip from the first housing portion; and a first pre-cured silicone adhesive layer disposed on an end of the first heat sink and in thermal relationship with the second surface of the flip chip.

In another aspect of the invention, the first and second housing portions are provided with a joint configured to control the pressure exerted on the flip chip through the heat sink components. In one embodiment, the flip chip is mounted between heat sink pedestals connected to the first and second housings. The joint between the housings controls the travel of the two housings toward each other when the assembly is put together. More particularly, the joint prevents excessive travel of the heat sink pedestals toward each other, which might damage the flip chip entrained between the pedestals.

In another form, the subject invention provides a method for conducting heat from a flip chip, the method including the steps of: (a) providing a flexible substrate having conductors thereon, a flip chip having a first surface with solder bumps on the first surface and a second surface oppositely disposed from the first surface, the flip chip being mounted to the substrate such that the solder bumps are registered with the conductors on the substrate; and (b) enclosing the substrate and flip chip within a housing so that a first pre-cured silicone adhesive disposed on a first heat sink contacts the second surface of the flip chip in a first thermal transfer relationship.

Other objects and advantages of this invention will be appreciated from the following detailed description.

BRIEF DESCRIPTION OF THE DRAWINGS

The present invention will now be described, by way of example, with reference to the accompanying drawings, in which.

DESCRIPTION OF PREFERRED EMBODIMENTS

Figure 1:
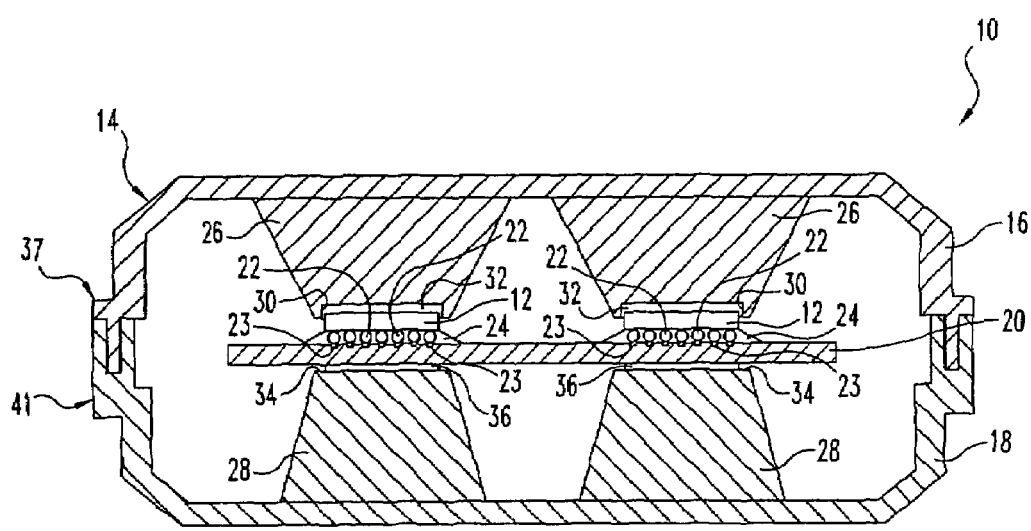
FIG. 1 is a side sectional view of a housing that encloses a pair of flip chips mounted to a substrate with heat conductive features in accordance with the principles of the subject invention.

Referring now to FIG. 1, there is shown a heat-dissipating assembly 10 for a pair of power flip chips 12. The assembly 10 includes a housing or enclosure 14 that encloses the flip chips 12. The housing 14 includes a first housing or enclosure portion or half 16 and a second housing or enclosure portion or half 18. The first and second housing portions 14 and 18 are preferably either die-cast or sheet metal. The first and second portions 16 and 18 are joined together as described more fully below to define the housing 14. The flip chip 12 is situated on a flexible substrate 20 such as laminate circuit board or thin substrate such as is known in the art.

Suitable substrates, for example, include thin laminates, rigid inorganic substrates and printed wiring boards (PWB).

Mounting of the flip chips 12 to the substrate 20 may be accomplished by conventional flip chip techniques, such as via preformed solder bumps 22 on the front side of the flip chip 12 (i.e. the surface of the flip chips 12 on which the flip chip microcircuitry is formed). The solder bumps 22 are registered with and reflow soldered to conductors 23 on the surface of the substrate 20 to yield solder connections with the substrate conductors 23. The flip chips 12 are underfilled with a suitable polymeric material 24, as is conventionally done in the art to promote the thermal cycle life of the solder connections.

As indicated above, the housing 14 is composed of first and second portions or members 16 and 18 each having a respective peripheral flange or edge structure 37 and 41. As described in greater detail below, the two edge structures 37 and 41 provide a manner of joining the two housing portions 16 and 18 together.

A pair of heat sinks in the form of pedestals 26 is shown projecting from an inner surface of the housing portion 16 and into the interior of the housing 14. The pedestals 26 may be integrally formed with the housing portion 16 or may be formed separately and subsequently attached to the housing portion 16. Thus, the pedestals 26 may be die-cast with the housing portion 16, formed as sheet metal with the housing portion 16, or formed thereafter out of a suitable thermal transfer material. In accordance with an aspect of the subject invention, the pedestals 26 have a depression or concavity 30 formed in the end thereof. The concavity 30 is preferably dimensioned so that the flip chip 12 can be at least partially received within the cavity 30, as depicted in FIG. 1. Thus, the perimeter of the concavity 30 is similarly configured to the perimeter of the flip chip 12, although larger in lateral dimension so the flip chip 12 can sit at least partially within the cavity 30 when the heat sink assembly 10 is fully seated together.

A silicone adhesive 32 is disposed in the concavity 30 and is thereafter cured. This forms a pre-cured silicone adhesive pad or layer 32 on the pedestal 26. The concavity 30 is sized to accommodate the flip chip 12. Particularly, the concavity 30 is preferably sized to be larger than the size of the flip chip 12 such that the cured silicone adhesive 32 is also preferably larger than the size of the flip chip 12. This allows the silicone pad 32 to receive the flip chip 12 when the housing portions 16 and 18 are fully seated together.

A further pair of heat sinks in the form of pedestals 28 extend or project from the housing portion 18 toward the interior thereof. The pedestals 28 may be integrally formed with the housing portion 18 or may be formed separately and subsequently attached to the housing portion 18. Thus, the pedestals 28 may be die-cast with the housing portion 18, formed as sheet metal with the housing portion 18 or formed thereafter out of a suitable thermal transfer material. The pedestals 28 define an upper or end surface 34 on which is disposed a silicone adhesive layer or pad 36. The silicone adhesive layer 36 is preferably pre-cured before assembly of the housing portions 16 and 18.

FIG. 1 shows assembly 10 in an assembled state with the housing portions 16 and 18 joined together. In this form, the substrate 20, and thus the flip chips 12, are retained by the pedestals 26 and 28. Particularly, the silicone adhesive pad 36 of the pedestal 28 is caused to contact and provide a slight pressure against the substrate 20. The silicone adhesive pad 36 is thus slightly compressed against the substrate 20 to provide thermal conductivity between the substrate 20 and the pedestal 28. Moreover, the silicone adhesive pad 32 of the pedestal 26 is caused to contact and provide a slight pressure against the flip chip 12. The silicone adhesive pad 32 is thus slightly compressed against the flip chip 12. In both instances, the pre-cured silicone adhesive pads 32 and 36 will still be pliable or soft after cure and thus conform to the shape of the flip chips 12 (in the case of the pad 32) and the substrate 20 (in the case of the pad 36). This also allows the flip chip assembly (i.e. flip chips 12 and substrate 20) to be removed from the housing 14 with little to no damage.

It should be appreciated that while only two flip chips 12 and pedestal pairs 26 and 28 (i.e. an upper pedestal 26 and lower pedestal 28 for each flip chip 12) are shown within the housing 14, the housing 14 may have any number of pedestal pairs and thus flip chips. Moreover, it should be appreciated that the height of the pedestals 26 and 28 are such that the flip chips 12 and substrate 20 are slightly compressed against and into the respective silicone adhesive pads 32 and 36 upon assembly of the housing portions 16 and 18.

Figure 2:
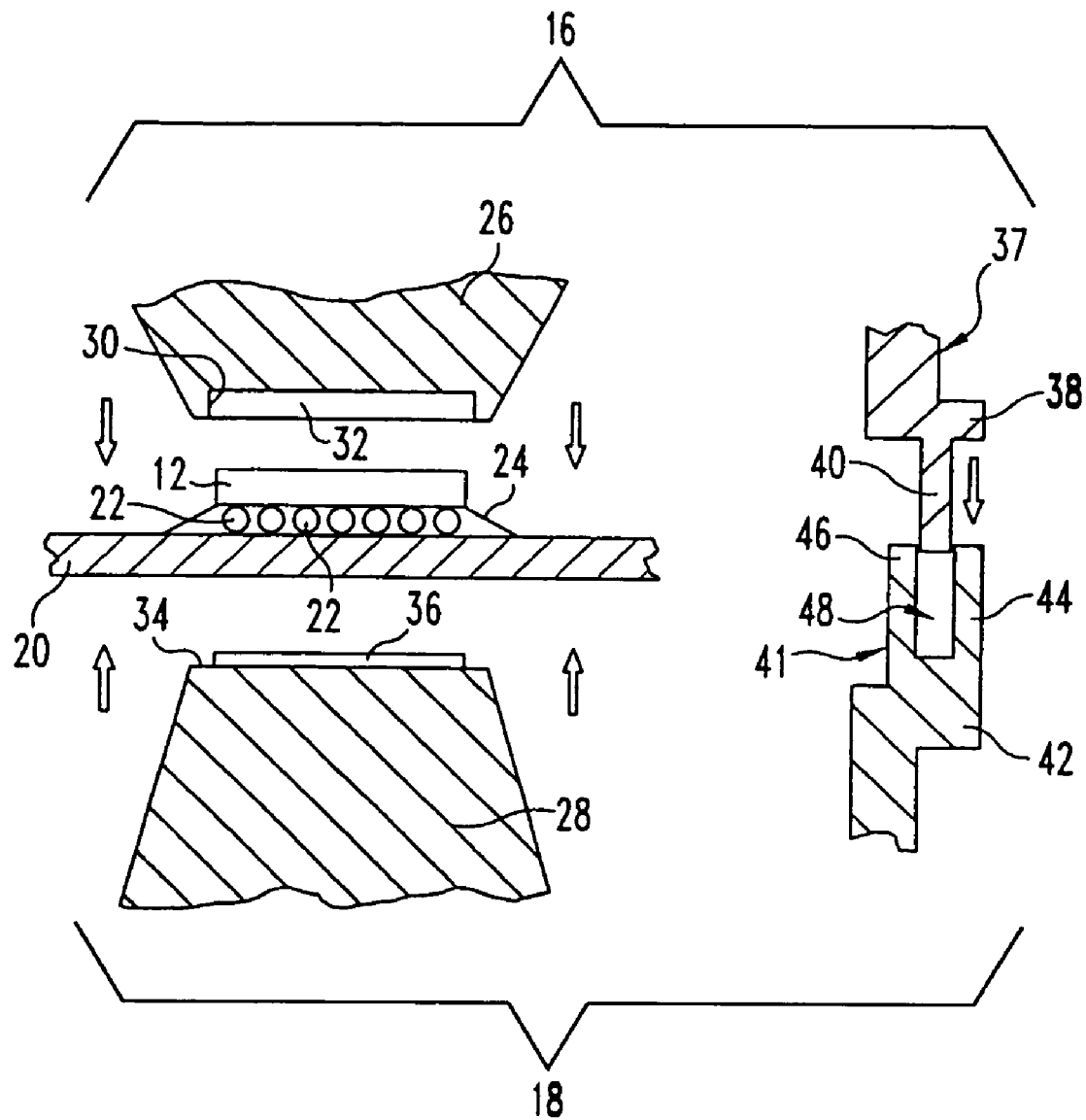
FIG. 2 is representation of one of the flip chips about to be retained between two heatsink pedestals of the housing and depicting the manner in which the two housing portions join.

Referring now to FIG. 2, there is illustrated the assembly of the housing portions 16 and 18. It should be appreciated that the flip chips 12 have previously been assembled onto the substrate 20. The two housing portions 16 and 18 are joined as indicated by the arrows. When this is accomplished, the pedestals 26, 28 with their respective pre-cured silicone adhesive pads 32, 36 contact the flip chips 12 and substrate 20 as indicated above. Moreover, the edge portions 37 and 41 of the housing portions 16 and 18 respectively, join together in a manner as now described.

Particularly, the edge portion 37, which extends about the outer periphery of the housing portion 16, includes a horizontal shelf or flat 38. A flange or wall 40 extends from the flat 38 in a perpendicular direction. In FIG. 2, the perpendicular direction is oriented as downward. The edge portion 41, which also extends about the outer periphery of the housing portion 18, includes a horizontal shelf or flat 42. Dual flanges or walls 44 and 46 extend from the flat 42 in a perpendicular direction. In FIG. 2, the perpendicular direction is oriented as upward. The dual walls 44 and 46 are spaced from each other to form an inner trough, channel, groove or the like 48. The channel 48 is dimensioned to receive the wall 40 that is dimensioned slightly smaller than the channel 48. The channel 48 and wall 40 can thus form a "tongue and groove" type joint. A silicone adhesive is applied in the channel 48 before joining of the housing portions 16 and 18.

The channel 48 and the wall 40 are also dimensioned so that the wall 40 bottoms out in the channel 48 when the silicone pads 32 and 36 contact and provide adequate contact pressure on the flip chips 12 and the substrate 20 respectively. The channel 48 and wall 40 provide the maximum travel of the housing portions 16 and 18 (and thus the pressure of the pads 32 and 36 into the flip chips 12 and the substrate 20) allowed in order not to crush the flip chips 12 into the adhesive pads or beyond. Additionally, a silicone adhesive is provided in the channel 48 that will bond with the wall 40. In this manner, an adhesive joint is provided in addition to the tongue and groove joint. Thus, it is contemplated that no fasteners will be used to secure the housing portions 16 and 18 together.

It should be appreciated that the subject invention minimizes any critical tolerance requirements for the assembly, and specifically the height tolerance for the heatsink pedestals 26 and 28. Furthermore, the subject invention protects the flip chips from damage at assembly and during use. Thus, the dimensions of the joint between the channel 48 and the wall 40 can be calibrated to limit the travel of the pedestals 26, 28 toward each other, thereby controlling the pressure exerted on the stacked components, substrate 20, pads 32, 36 and flip chips 12. Alternatively, the flat 38 can limit the housing travel when it contacts the walls 44, 46, where the height of the wall 40 is significantly less than the depth of the channel 48. However, it is preferred that the channel/wall joint provide the control feature of the present invention, as described above.

While the subject invention may be used in many applications, the subject invention may be used, for example, in powertrain gasoline or diesel engine modules (ECMs), powertrain engine and transmission control modules (PCMs), powertrain transmission control modules (TCMs), and powertrain non-automotive control modules.

While this invention has been described in terms of a preferred embodiment, it is apparent that other forms could be adopted by one skilled in the art. For example, various components of the assembly 10 could be configured differently from that shown in the figures. Moreover, appropriate materials could be substituted for those noted. Accordingly, the scope of the invention is to be limited only by the claims.

What is claimed is:

1. A heat-dissipating assembly for removing heat from a flip-chip semiconductor device, the assembly comprising:
   a housing having a thermally-conductive first housing portion and a second housing portion;
   a flexible substrate supported within the housing, the substrate having conductors thereon;
   a flip chip mounted to the substrate, the flip chip having a first surface and solder bumps on the first surface registered with the conductors on the substrate, the flip chip having a second surface oppositely disposed from the first surface;
   a first heat sink including a pedestal extending inwardly towards the flip chip from the first housing portion; and
   a first pliable pre-cured silicone adhesive layer disposed on an end of the first heat sink and in thermal relationship with the second surface of the flip chip, wherein said silicone adhesive layer is compressively loaded between said first heat sink and second surface of the flip chip.

2. The assembly of claim 1, further comprising:
   a second heat sink extending inwardly towards the flip chip from the second housing portion; and
   a second pliable layer disposed on an end of the second heat sink and in thermal relationship with the first surface of the flip chip.

3. The assembly of claim 2, wherein the second heat sink includes a pedestal.

4. The assembly of claim 1, further comprising:
   a first edge configuration on the first housing portion and a second edge configuration on the second housing portion, the first and second edge configurations configured for mating engagement.

5. The assembly of claim 3, further comprising:
   a first edge configuration on the first housing portion and a second edge configuration on the second housing portion, the first and second edge configurations configured for mating engagement and further configured to limit the travel of said first and second pedestals toward each other to limit the pressure exerted on the flip chip disposed between said pedestals.

6. The assembly of claim 3 further comprising means for limiting the travel of said first and second pedestals toward each other to limit the pressure exerted on the flip chip disposed between said pedestals.

7. A heat-dissipating assembly for removing heat from a flip-chip semiconductor device, the assembly comprising:
   a housing having a thermally-conductive first housing portion and a second housing portion;
   a flexible substrate supported within the housing, the substrate having conductors thereon;
   a flip chip mounted to the substrate, the flip chip having a first surface and solder bumps on the first surface registered with the conductors on the substrate, the flip chip having a second surface oppositely disposed from the first surface;
   a first heat sink extending inwardly towards the flip chip from the first housing portion; and
   a first pliable layer disposed on an end of the first heat sink and in thermal relationship with the second surface of the flip chip,
   wherein said first heat sink includes a pedestal, and
   wherein said pedestal includes a concavity in which the first pliable layer is disposed.

8. The assembly of claim 7, wherein said concavity is sized to receive at least a portion of said flip chip therein.

9. A heat-dissipating assembly for removing heat from a flip-chip semiconductor device, the assembly comprising:
   a housing having a thermally-conductive first housing portion and a second housing portion;
   a flexible substrate supported within the housing, the substrate having conductors thereon;
   a flip chip mounted to the substrate, the flip chip having a first surface and solder bumps on the first surface registered with the conductors on the substrate, the flip chip having a second surface oppositely disposed from the first surface;
   a first heat sink extending inwardly towards the flip chip from the first housing portion;
   a first pliable layer disposed on an end of the first heat sink and in thermal relationship with the second surface of the flip chip;
   a second heat sink extending inwardly towards the flip chip from the second housing portion; and
   a second pliable layer disposed on an end of the second heat sink and in thermal relationship with the first surface of the flip chip,
   wherein said first and second pliable layers are pre-cured silicone adhesive layers.

10. A heat-dissipating assembly for removing heat from a flip-chip semiconductor device, the assembly comprising:
    a housing having a thermally-conductive first housing portion and a second housing portion;
    a flexible substrate supported within the housing, the substrate having conductors thereon;
    a flip chip mounted to the substrate, the flip chip having a first surface and solder bumps on the first surface registered with the conductors on the substrate, the flip chip having a second surface oppositely disposed from the first surface;
    a first heat sink extending inwardly towards the flip chip from the first housing portion; and
    a first pliable layer disposed on an end of the first heat sink and in thermal relationship with the second surface of the flip chip; and
    a first edge configuration on the first housing portion and a second edge configuration on the second housing portion, the first and second edge configurations configured for mating engagement, wherein said first and second edge configurations are sealed together with a silicone adhesive.

11. A heat-dissipating assembly for removing heat from a flip-chip semiconductor device, the assembly comprising:
- a housing having a thermally-conductive first housing portion and a second housing portion;
- a flexible substrate supported within the housing, the substrate having conductors thereon;
- a flip chip mounted to the substrate, the flip chip having a first surface and solder bumps on the first surface registered with the conductors on the substrate, the flip chip having a second surface oppositely disposed from the first surface;
- a first heat sink extending inwardly towards the flip chip from the first housing portion; and
- a first pliable layer disposed on an end of the first heat sink and in thermal relationship with the second surface of the flip chip; and
- a first edge configuration on the first housing portion and a second edge configuration on the second housing portion, the first and second edge configurations configured for mating engagement, wherein the first edge configuration includes a flange that is received in a groove of the second edge structure.

* * * * *